(12) United States Patent
Yamamoto et al.

(10) Patent No.: US 10,749,134 B2
(45) Date of Patent: Aug. 18, 2020

(54) ORGANIC EL DISPLAY PANEL

(71) Applicant: JOLED INC., Tokyo (JP)

(72) Inventors: Tetsuro Yamamoto, Tokyo (JP);
Yasunobu Hiromasu, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/384,424

(22) Filed: Apr. 15, 2019

(65) Prior Publication Data

US 2019/0326547 A1 Oct. 24, 2019

(30) Foreign Application Priority Data

Apr. 24, 2018 (JP) ................................ 2018-083298

(51) Int. Cl.
*H01L 51/52* (2006.01)
*H01L 27/32* (2006.01)

(52) U.S. Cl.
CPC ...... *H01L 51/5221* (2013.01); *H01L 27/3244* (2013.01); *H01L 51/5206* (2013.01)

(58) Field of Classification Search
CPC ......... G09G 3/30–3291; H01L 27/3244–3246; H01L 23/522–5228
See application file for complete search history.

(56) References Cited

U.S. PATENT DOCUMENTS

| | | | |
|---|---|---|---|
| 2002/0158835 A1* | 10/2002 | Kobayashi | .......... H01L 51/5218 345/100 |
| 2009/0046041 A1* | 2/2009 | Tanikame | ............ G09G 3/3225 345/76 |
| 2018/0006095 A1* | 1/2018 | Sakairi | ................ H01L 27/3206 |

FOREIGN PATENT DOCUMENTS

JP 2002-318556 10/2002

* cited by examiner

*Primary Examiner* — Hang Lin
(74) *Attorney, Agent, or Firm* — Greenblum & Bernstein, P.L.C.

(57) ABSTRACT

The pixels of an organic EL display panel each include an anode electrode layer, an organic layer, and a cathode electrode layer. Each of the organic layer and the cathode electrode layer is shared by the plurality of pixels. An organic EL element in each of the pixels includes an anode section, a cathode section, and a light emitting section. A conductor layer having a recess is provided in a region outside a region of the organic EL element in a view from a light exiting direction in which the organic EL element emits light. The recess includes a coated section that is covered with the organic layer and a conductor exposed section where the conductor layer is exposed. The cathode electrode layer is connected to part of the conductor exposed section.

11 Claims, 12 Drawing Sheets

ORGANIC EL DISPLAY PANEL

CROSS REFERENCE TO RELATED APPLICATION

The present application is based on and claims priority of Japanese Patent Application No. 2018-083298 filed on Apr. 24, 2018. The entire disclosure of the above-identified application, including the specification, drawings and claims is incorporated herein by reference in its entirety.

FIELD

The present disclosure relates to an organic EL display panel including a plurality of organic EL elements.

BACKGROUND

As a display panel used as part of a display apparatus, such as a digital television, there is a known organic electro luminescence (EL) display panel having a plurality of pixels arranged in a matrix. In an organic EL display panel for color display, for example, three organic EL elements corresponding to colors RGB form three sub-pixels, and the combination of the three sub-pixels forms one pixel.

Each of the organic EL elements includes an anode section, a cathode section, and a light emitting section containing an organic material and provided between the anode section and the cathode section. The organic EL elements each emit light when voltage is applied to the anode section and the cathode section to inject holes and electrons into the light emitting section and the injected holes and electrons recombine with each other.

An organic EL display panel having a top-emission structure has a structure in which an anode electrode layer, an organic layer, and a cathode electrode layer are sequentially layered on a substrate. The anode section that forms each of the organic EL elements is formed of part of the anode electrode layer, the cathode section that forms the organic EL element is formed of part of the cathode electrode layer, and the light emitting section that forms the organic EL element is formed of part of the organic layer.

For example, in an organic EL display panel in which the cathode electrode layer is formed across the surface of the substrate and the plurality of pixels share the cathode electrode layer, insufficient power is supplied to a pixel located far away from a power supply, reducing the amount of light emitted from the pixel, resulting in poor image quality, such as luminance unevenness, in some cases. To supply a pixel located far away from the power supply with sufficient power, it is conceivable to employ a cathode electrode layer having low resistance. As an example of the cathode electrode layer having low resistance, Patent Literature 1 discloses a technology for connecting an auxiliary electrode to a cathode electrode layer to lower the resistance of the cathode electrode layer.

CITATION LIST

Patent Literature

[Patent Literature 1] Japanese Unexamined Patent Application Publication No. 2002-318556

SUMMARY

Technical Problem

In the organic EL display panel disclosed in Patent Literature 1, however, the connection between the cathode electrode layer and the auxiliary electrode is insufficient, and the cathode section, which is part of the cathode electrode layer, experiences variation in potential, resulting in poor image quality in some cases.

The present disclosure has been made to solve the problem described above, and an object of the present disclosure is to suppress poor image quality resulting from variation in potential at a cathode section, which is part of a cathode electrode layer, in an organic EL display panel in which a plurality of pixels share the cathode electrode layer.

Solution to Problem

In order to achieve the above-described object, in accordance with an aspect of the present disclosure, there is provided an organic electro luminescence (EL) display panel including: a plurality of pixels, wherein the plurality of pixels each include an anode electrode layer, an organic layer, and a cathode electrode layer, the organic layer having an area greater than an area of the anode electrode layer, at least part of the organic layer covering the anode electrode layer, at least part of the cathode electrode layer covering the organic layer, each of the organic layer and the cathode electrode layer is continuously shared by the plurality of pixels, the plurality of pixels each include at least one organic EL element, the at least one organic EL element includes an anode section that is part of the anode electrode layer, a cathode section that is part of the cathode electrode layer, and a light emitting section that is part of the organic layer and located between the anode section and the cathode section, the organic EL display panel further includes a conductor layer having a recess, the conductor layer being located in a region outside a region of the at least one organic EL element in a view from a light exiting direction in which the at least one organic EL element emits light, the recess in the conductor layer includes a coated section and a conductor exposed section, the coated section being covered with the organic layer, the conductor exposed section not being covered with the organic layer, the conductor exposed section exposing the conductor layer, and the cathode electrode layer is connected to at least part of the conductor exposed section.

In order to achieve the above-described object, in accordance with another aspect of the present disclosure, there is an organic electro luminescence (EL) display panel including: a plurality of pixels arranged in a matrix along a first direction and a second direction that intersects the first direction, wherein the plurality of pixels each include a plurality of sub-pixels having different colors, the plurality of sub-pixels of the plurality of pixels being arranged along the first direction, the plurality of sub-pixels each include an anode electrode layer, an organic layer, an organic common layer, and a cathode electrode layer, at least part of the organic layer covering the anode electrode layer, the organic common layer having an area greater than an area of each of the anode electrode layer and the organic layer, at least part of the organic common layer covering the organic layer, the cathode electrode layer having an area greater than the area of each of the anode electrode layer and the organic layer, and at least part of the cathode electrode layer covering the organic common layer, each of the organic common layer and the cathode electrode layer is continuously shared by at least adjacent sub-pixels adjacent to each other in the first direction among the plurality of sub-pixels, the plurality of sub-pixels each include an organic EL element, the organic EL element includes an anode section that is part of the anode electrode layer, a cathode section that is part of the cathode electrode layer, a light emitting section that is part of the organic layer and located between the anode section and the cathode section, and an interlayer organic section that is part of the organic common layer and located between the light emitting section and the cathode section, the organic EL display panel further includes a conductor layer having a recess, the conductor layer being located between at least two of the plurality of pixels arranged in the first direction, the recess in the conductor layer includes a coated section and a conductor exposed section, the coated section being covered with the organic common layer, the conductor exposed section not being covered with the organic common layer, the conductor exposed section exposing the conductor layer, and the cathode electrode layer is connected to at least part of the conductor exposed section.

Advantageous Effects

According to the disclosure, poor image quality resulting from variation in potential at a cathode section which is a part of a cathode electrode layer can be suppressed in an organic EL display panel in which a plurality of pixels share a cathode electrode layer.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Figure 1:
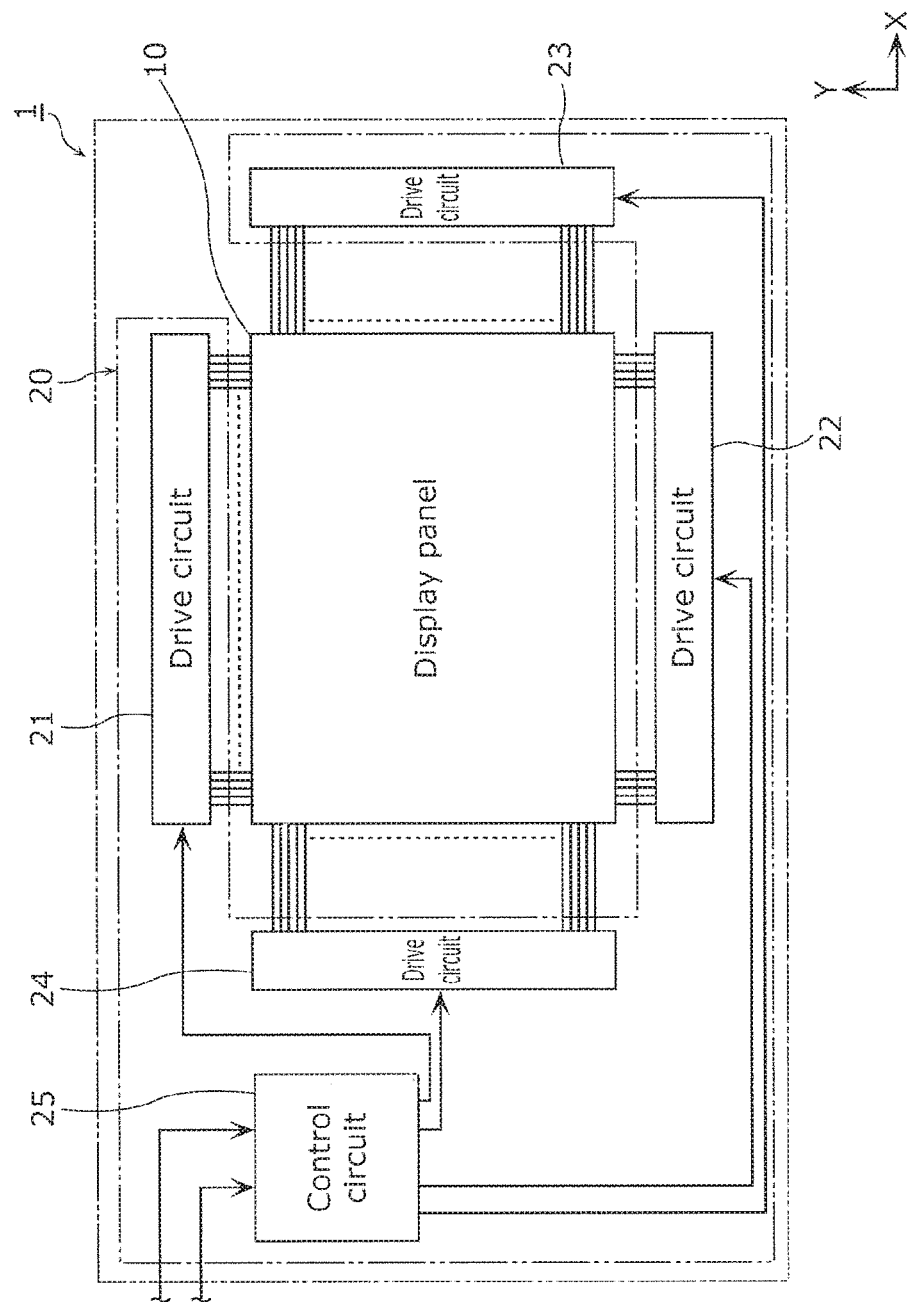
FIG. 1 is a diagrammatic view showing a display apparatus including an organic EL display panel according to Embodiment 1.

Hereinafter, certain exemplary embodiments of the organic EL display panel according to the present disclosure are described in greater detail with reference to the accompanying Drawings. It should be noted that all the embodiments described below are preferable examples of the present disclosure. Numerical values, shapes, materials, constituent elements, arrangement positions and the connection configuration of the constituent elements, and the like described in the following embodiments are merely examples, and are not intended to limit the present disclosure. The present disclosure is characterized by the appended claims. Therefore, among the constituent elements in the following embodiments, constituent elements that are not described in independent claims that show the most generic concept of the present disclosure are described as elements constituting more desirable configurations, although such constituent elements are not necessarily required to achieve the object of the present disclosure.

In the drawings, substantially the same components have the same reference character. Further, the drawings are each a diagrammatic view, and the ratio between the thickness of a film and the size of each portion, for example, is not necessarily exactly reflected in the drawings.

Embodiment 1

[1-1. Configuration of Display Apparatus]

Figure 2:
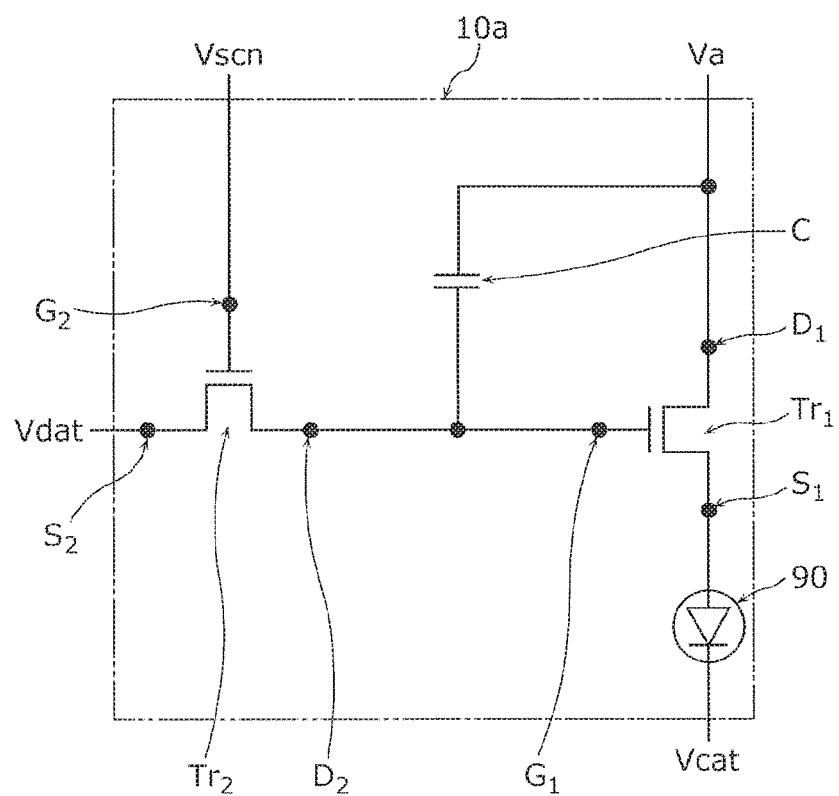
FIG. 2 is a circuit diagram of each pixel of the organic EL display panel according to Embodiment 1.

A display apparatus 1 including an organic EL display panel 10 according to the present embodiment will be described with reference to FIGS. 1 and 2. FIG. 1 is a diagrammatic view showing the display apparatus 1 including the organic EL display panel 10. FIG. 2 is a circuit diagram of each pixel 10a of the display panel 10.

The display apparatus 1 includes the organic EL display panel 10 (hereinafter referred to as display panel 10) and a drive control circuit section 20 connected to the display panel 10.

The display panel 10 includes a display section 10c having a plurality of pixels 10a arranged in a matrix. In an organic EL display panel for color display, for example, three organic electro luminescence (EL) elements corresponding to red, green, and blue colors (RGB) form three sub-pixels, and the combination of the three sub-pixels forms one pixel 10a. The pixels 10a are not each necessarily formed of the three sub-pixels and may instead be formed of one white (W) sub-pixel or RGBW four sub-pixels.

The drive control circuit section 20 includes, for example, four drive circuits 21, 22, 23, and 24 and a control circuit 25.

[1-2. Circuit Configuration of Each Pixel and Display Panel]

The circuit configurations of each of the pixels 10a and the display panel 10 will next be described with reference to FIG. 2.

The pixels 10a each include, for example, a drive transistor Tr1, a switching transistor Tr2, a capacitor C, and an organic EL element 90. The drive transistor Tr1 and the switching transistor Tr2 are each, for example, a field effect transistor.

The switching transistor Tr2 has a gate G2 connected to a scan line Vscn, a source S2 connected to a data line Vdat, and a drain D2 connected to a gate G1 of the drive transistor Tr1. The drive transistor Tr1 has a drain D1 connected to a power source line Va and a source S1 connected to an anode section of the organic EL element 90. A cathode section of the organic EL element 90 is connected to a power source line Vcat. One end of the capacitor C is connected to the drain D2 of the switching transistor Tr2 and the gate G1 of the drive transistor Tr1, and the other end of the capacitor C is connected to the power source line Va.

In the circuit described above, changing voltage applied to the gate G1 of the drive transistor Tr1 allows control of the value of current flowing through the organic EL element 90 and change in the brightness of the pixel 10a.

Figure 3:
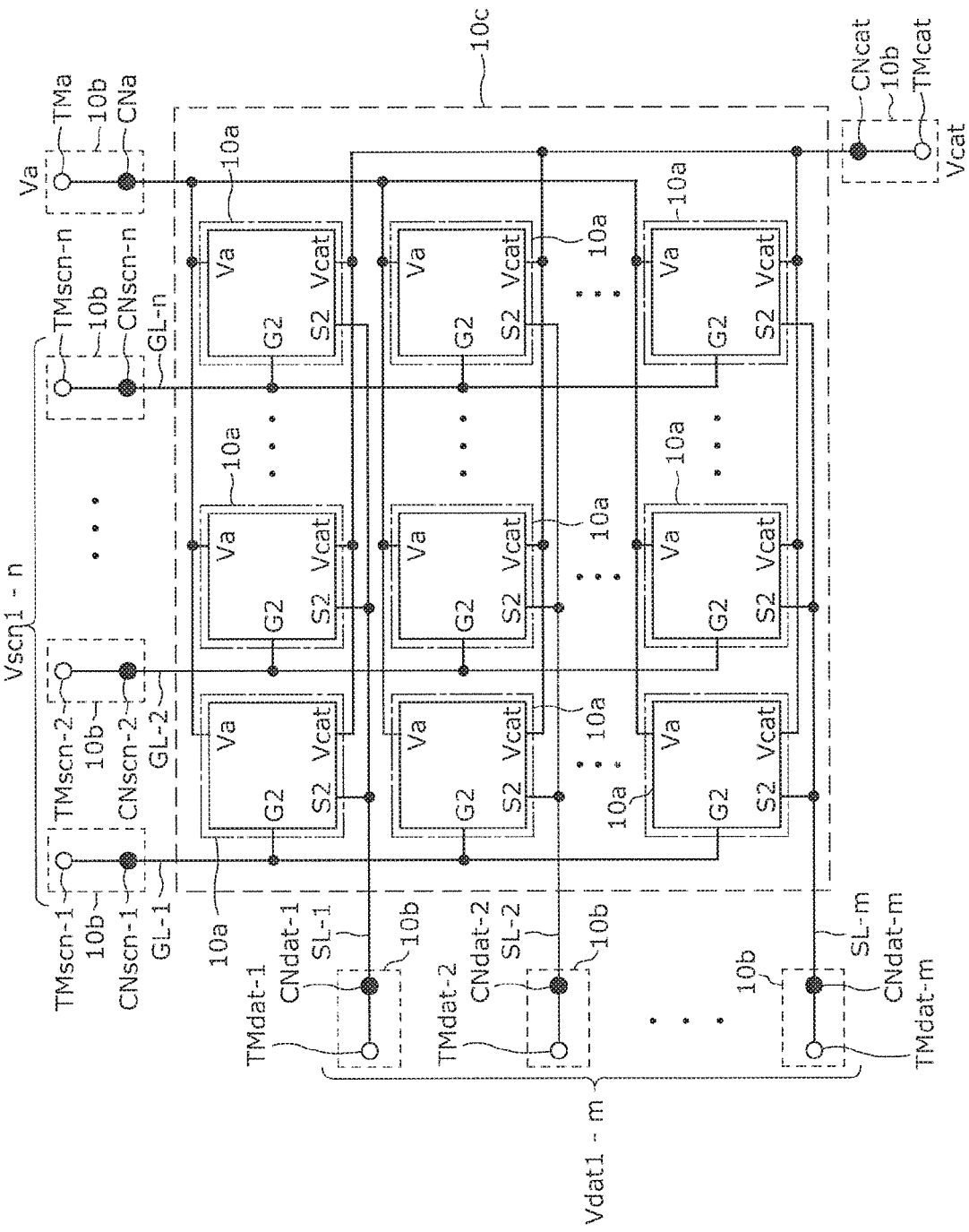
FIG. 3 shows the circuit configuration of the organic EL display panel according to Embodiment 1.

FIG. 3 shows the circuit configuration of the display panel 10. In the display panel 10, the plurality of pixels 10a are arranged in a matrix formed of m rows and n columns.

Gate lines GL-1 to GL-n are drawn from the gates G2 of the pixels 10a. In a connection section 10b outside the display section 10c, the gate lines GL-1 to GL-n are respectively connected to external connection terminals TMscn-1 to TMscn-n via wiring connection sections CNscn-1 to CNscn-n and further connected to scan lines Vscn-1 to Vscn-n.

Source lines SL-1 to SL-m are drawn from the sources S2 of the pixels 10a. In the connection section 10b, the source lines SL-1 to SL-n are connected to external connection terminals TMdat-1 to TMdat-m via wiring connection sections CNdat-1 to CNdat-m and further connected to data lines Vdat-1 to Vdat-m.

The power source lines Va from the pixels 10a are bundled up and connected to an external connection terminal TMa via a wiring connection section CNa in the connection section 10b. The power source lines Vcat from the pixels 10a are bundled up and connected to an external connection terminal TMcat via a wiring connection section CNcat in the connection section 10b.

[1-3. Structure of Display Panel]

Figure 4:
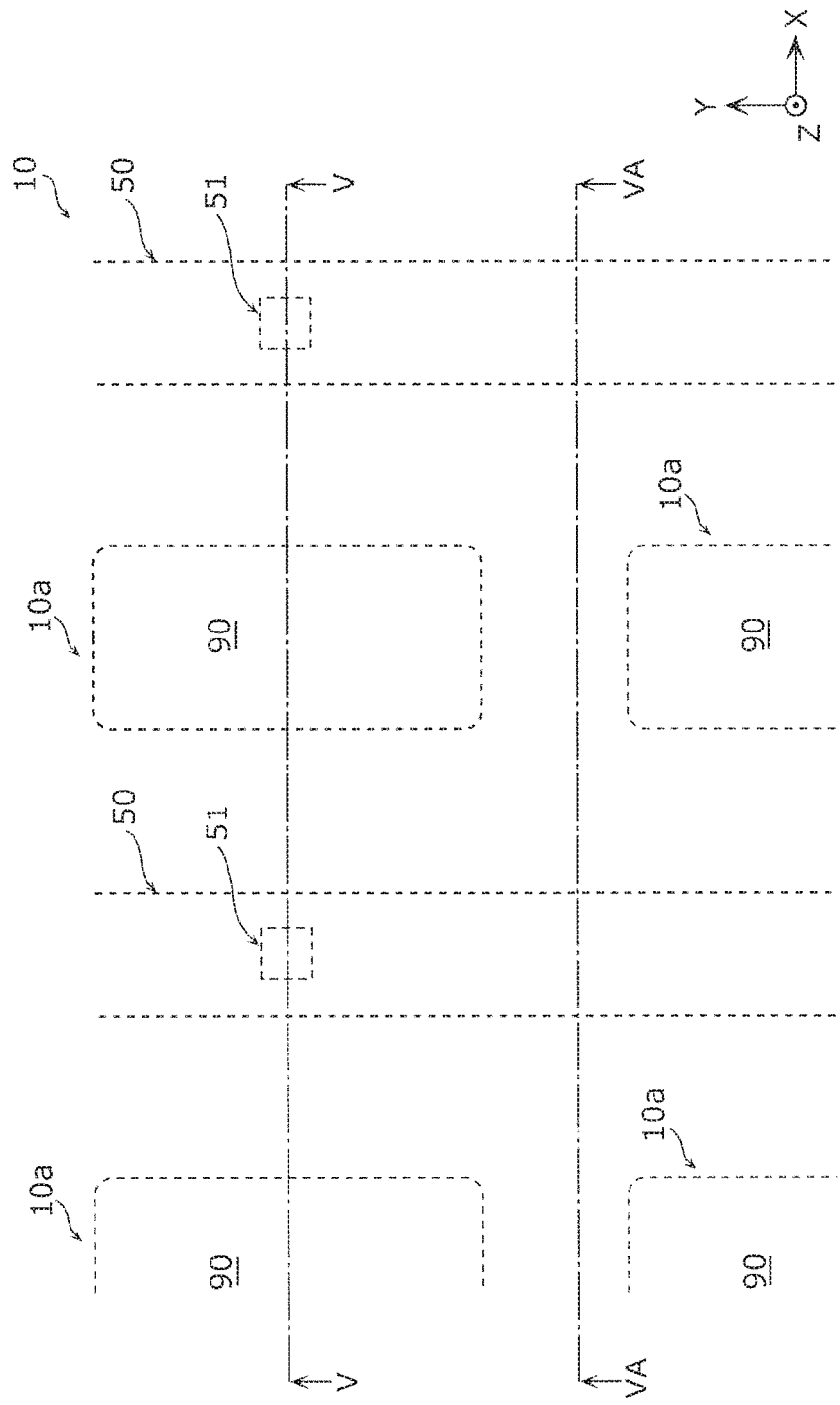
FIG. 4 is a diagrammatic view of the organic EL display panel according to Embodiment 1 viewed from a light exiting direction.
Figure 5:
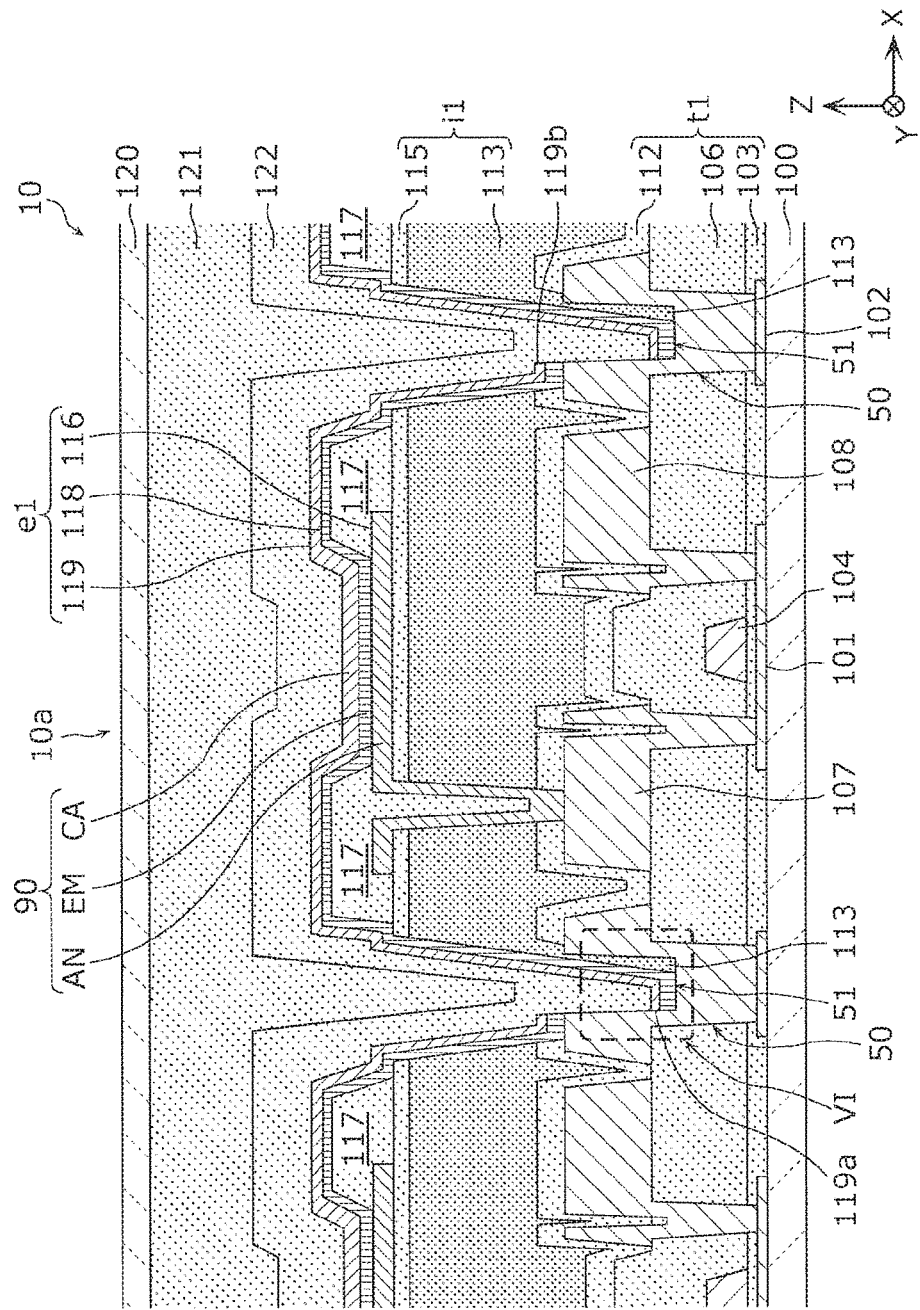
FIG. 5 is a cross-sectional view of the organic EL display panel according to Embodiment 1 taken along the line V-V shown in FIG. 4.

The structure of the display panel 10 will next be described with reference to FIGS. 4 and 5. FIG. 4 is a diagrammatic view of the display panel 10 viewed from a light exiting direction. FIG. 5 is a cross-sectional view of the display panel 10 taken along the line V-V shown in FIG. 4.

In the following description, the direction in which the columns of the plurality of the pixels 10a are arranged is called a first direction X, and the direction which intersects the first direction X and in which the rows of the plurality of the pixels 10a are arranged is called a second direction Y, as shown in FIG. 4. The direction which is perpendicular to both the first direction X and the second direction Y and in which the organic EL elements 90 emit light is called a light exiting direction Z. The positive side in the light exiting direction Z is called an upper side, and the negative side in the light exiting direction Z is called a lower side in some cases. In comparison between FIG. 3 and FIG. 4, the rightward direction in the plane of view in FIG. 3 is the direction Y, and the downward direction in the plane of view in FIG. 3 is the direction X.

The display panel 10 is an organic EL display panel having a top-emission structure. In the display panel 10, a TFT (thin film transistor) layer t1 is formed on a TFT substrate 100, an interlayer insulating layer it is formed on the TFT layer t1, and an EL layer e1 is formed on the interlayer insulating layer i1, as shown in FIG. 5. A protective film 122, a sealing resin 121, and a sealing substrate 120 are layered in the presented order on the EL layer e1.

Similarly, the pixels 10a each have a structure in which the TFT layer t1, the interlayer insulating layer i1, and the EL layer e1 are sequentially layered on the TFT substrate 100. The pixels 10a each includes the organic EL element 90, which will be described later.

The TFT substrate 100 is, for example, a glass substrate, a quartz substrate, a silicon substrate, a metal substrate, a gallium-arsenide substrate, or a plastic substrate.

The TFT layer t1 includes channels 101, a gate insulating layer 103, gate electrodes 104, a protective layer 106, source electrodes 107, drain electrodes 108, and a passivation layer 112, as shown in FIG. 5.

The channel 101 is provided on the TFT substrate 100. The gate insulating layer 103 is so provided as, to cover the surfaces of the channels 101 and the TFT substrate 100. The gate electrodes 104 is provided on the gate insulating layer 103. The protective layer 106 is so provided as to cover the gate electrodes 104 and the gate insulating layer 103.

The gate electrodes 104 are each made, for example, of a molybdenum-tungsten alloy or formed of a laminate made of titanium and aluminum. The gate insulating layer 103 is, for example, a laminate made of a silicon oxide and a silicon nitride. The channels 101 are each made, for example, of amorphous indium gallium zinc oxide (IGZO). The protective layer 106 is, made, for example, of a silicon oxide.

The source electrodes 107 and the drain electrodes 108 are so provided as to separate from each other on the protective layer 106 located above the channels 101 and the gate electrodes 104. The source electrodes 107 are each connected to the corresponding channel 101 via an interlayer conductor provided in the protective layer 106 and the gate insulating layer 103. The drain electrodes 108 are each connected to the corresponding channel 101 via an interlayer conductor different from the interlayer conductor described above and provided in the protective layer 106 and the gate insulating layer 103. The source electrodes 107 and the drain electrodes 108 are each, for example, a laminate made, for example, of titanium and aluminum.

The passivation layer 112 is so provided as to cover the source electrodes 107, the drain electrodes 108, and the protective layer 106. The passivation layer 112 is made, for example, of a silicon oxide.

The correspondence between FIG. 5 and FIG. 2 is as follows: The gate G1 in FIG. 2 corresponds to the gate electrode 104; the source S1 in FIG. 2 corresponds to the source electrode 107; and the drain D1 in FIG. 2 corresponds to the drain electrode 108. The transistor Tr2 and the capacitor C shown in FIG. 2 are each present in a cross section different from that shown in FIG. 5 and are therefore not shown in FIG. 5.

The interlayer insulating layer it is formed on the TFT layer t1. The interlayer insulating layer i1 includes an insulating layer 113 and an insulating layer 115. Specifically, the insulating layer 113 is provided on the passivation layer 112, and the insulating layer 115 is provided on the insulating layer 113. The insulating layers 113 and 115 are each, for example, an organic layer containing an organic material, such as polyimide, polyamide, or an acrylic resin material.

The EL layer e1 is formed on the interlayer insulating layer i1. The EL layer e1 includes an anode electrode layer 116, a bank (barrier) 117, an organic layer 118, and a cathode electrode layer 119. The organic EL elements 90 are formed in the region where the anode electrode layer 116, the organic layer 118, and the cathode electrode layer 119, out of the layers described above, are layered on each other.

The organic EL elements 90 each include an anode section AN, a cathode section CA, and a light emitting section EM provided between the anode section AN and the cathode section CA. The organic EL elements 90 each emit light when voltage is applied across the gap between the anode section AN and the cathode section CA to inject holes and electrons into the light emitting section EM and the injected holes and electrons recombine with each other. In the present embodiment, the anode section AN is part of the anode electrode layer 116, the cathode section CA is part of the cathode electrode layer 119, and the light emitting section EM is part of the organic layer 118.

The anode electrode layer 116 is a light reflective layer and is provided on the insulating layer 115. The anode section AN is connected to the source electrode 107 via the anode electrode layer 116 formed in a through hole in the insulating layers 115 and 113 and the passivation layer 112. The anode electrode layer 116 is, for example, a laminate made of tungsten and aluminum or an aluminum alloy and is formed by using sputtering or vacuum deposition.

The bank 117 is so provided as to form a frame that surrounds the outer edge of the anode section AN. The bank 117 is made, for example, of an insulating resin material or an insulating organic material.

The organic layer 118 is a layer containing a luminescent organic material and is formed on the anode electrode layer 116 and the bank 117. The organic layer 118 has an area greater than the area of the anode electrode layer 116, and at least part of the organic layer 118 is so disposed as to cover the anode electrode layer 116. The organic layer 118 contains a host made of a polymer material and a dopant that functions as a light emission center when the electrons and holes combine with each other, and the organic layer 118 is formed, for example, by using an ink jet method or vacuum deposition.

The cathode electrode layer 119 is a light transmissive layer. The cathode electrode layer 119 has an area greater than the area of the anode electrode layer 116, and at least part of the cathode electrode layer 119 is so disposed as to cover the organic layer 118. The cathode electrode layer 119 is made, for example, of an indium tin oxide (ITO) or an indium zinc oxide (IZO) and is formed by using sputtering or vacuum deposition.

Figure 5A:
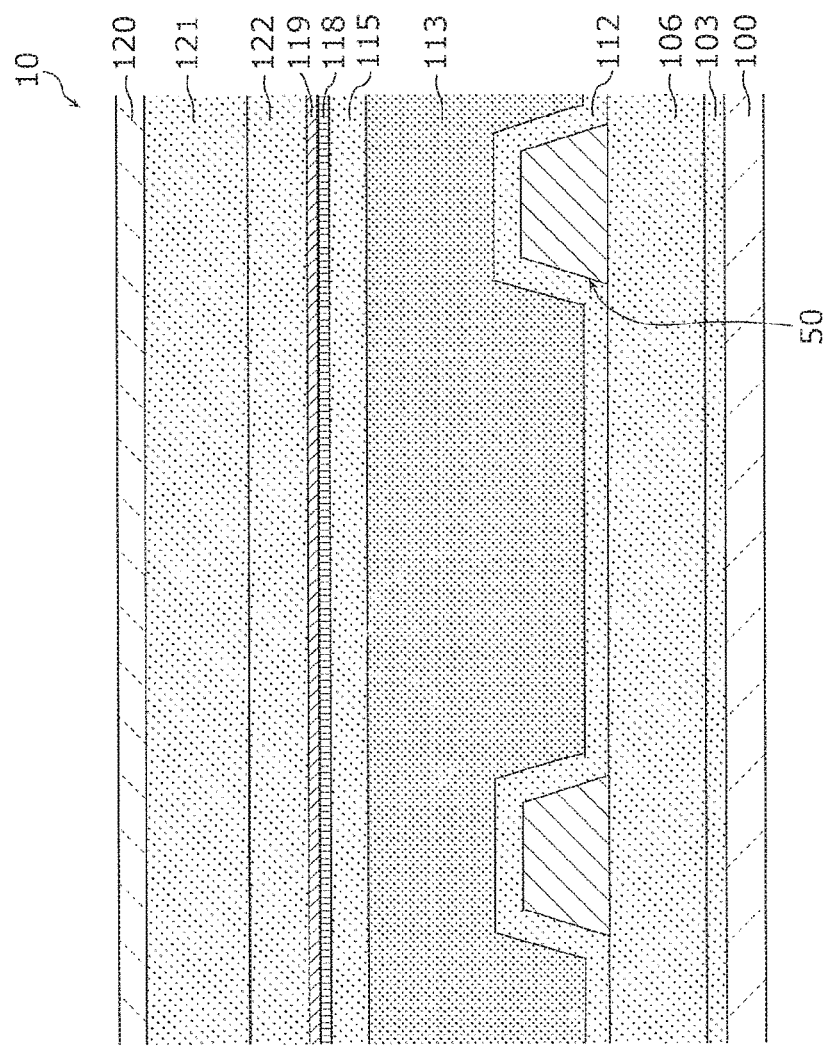
FIG. 5A is a cross-sectional view of the organic EL display panel according to Embodiment 1 taken along the line VA-VA shown in FIG. 4.

FIG. 5A is a cross-sectional view of the display panel 10 taken along the line VA-VA shown in FIG. 4. In FIG. 5A, no power source line or source line is shown for simplification. In a cross-sectional view of the region between the plurality of pixels 10a taken along the line VA-VA described above, at least part of the organic layer 118 and the cathode electrode layer 119 are continuous in the region between the plurality of pixels 10a, as shown in FIG. 5A. That is, at least part of each of the organic layer 118 and the cathode electrode layer 119 is shared by the plurality of pixels 10a.

The display panel 10 is provided with a conductor layer 50, as shown in FIGS. 4 and 5. The conductor layer 50, when viewed from the light exiting direction Z, is provided in a region in each of the pixels 10a, in more detail, in a region outside the regions where the organic EL elements 90 are formed.

The conductor layer 50 in the present embodiment is a metal layer where the power source lines Va are present (see FIG. 3). The conductor layer 50 is formed on a semiconductor material layer 102 provided on the TFT substrate 100. The conductor layer 50 may instead be provided on another conductor layer different from the conductor layer 50. The conductor layer 50 passes through part of the gate insulating layer 103 and the protective layer 106 and is connected to the semiconductor material layer 102. The conductor layer 50 contains a low-resistance material and, for example, is formed of a laminate made of titanium and aluminum or is made of an aluminum alloy. The passivation layer 112 having openings is formed on the conductor layer 50.

Recesses 51 each having an indented shape are formed in the conductor layer 50. The recesses 51 are formed in the openings of the passivation layer 112. The insulating layer 113, the organic layer 118, the cathode electrode layer 119, and the protective film 122 are formed in the recesses 51.

One end 119a of the cathode electrode layer 119 is connected to the conductor layer 50 in each of the recesses 51. The other end 119b of the cathode electrode layer 119 is not connected to the conductor layer 50.

Figure 6:
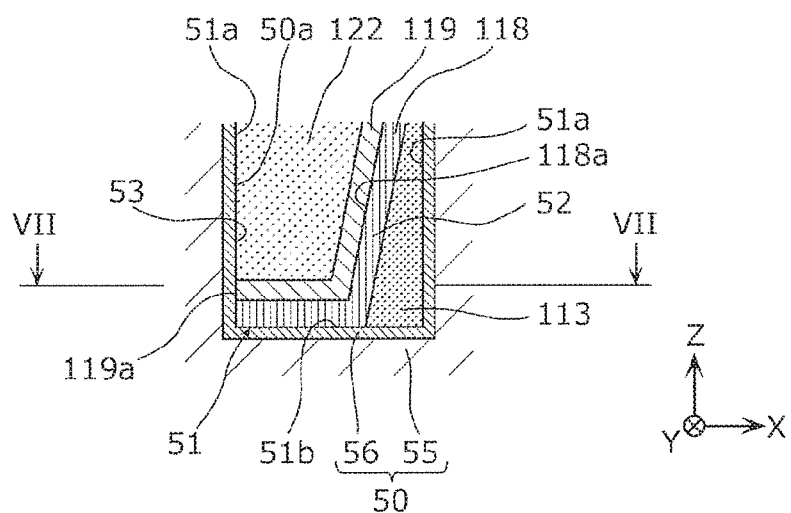
FIG. 6 is an enlarged view of a recess in a conductor layer of the organic EL display panel shown in FIG. 5.
Figure 7:
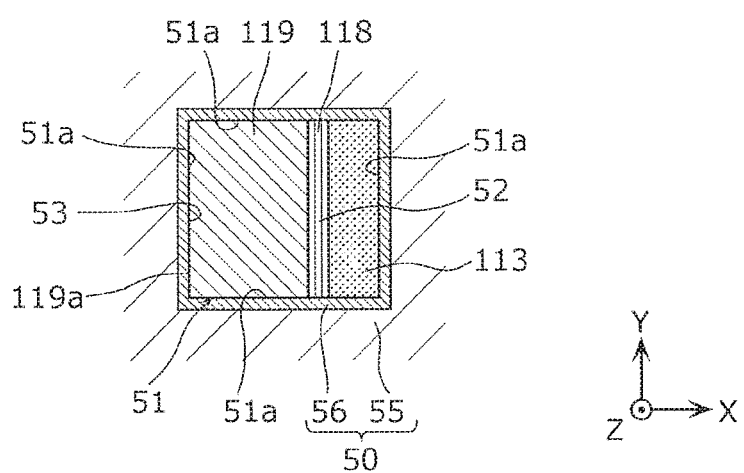
FIG. 7 is a cross-sectional view of the recess in the conductor layer shown in FIG. 6 taken along the line VII-VII.

The structure of each of the recesses 51 in the conductor layer 50 will now be described. FIG. 6 is an enlarged view of each of the recesses 51 in the conductor layer 50 shown in FIG. 5 (portion VI shown in FIG. 5). FIG. 7 is a cross-sectional view of the recess 51 of in conductor layer 50 shown in FIG. 6 taken along the line VII-VII.

The recess 51 in the conductor layer 50 includes a coated section 52 and a conductor exposed section 53, as shown in FIG. 6. The coated section 52 is a portion covered with the insulating layer 113 and the organic layer 118. The conductor exposed section 53 is a portion where it is not covered with the insulating layer 113 or the organic layer 118 but the conductor layer 50 is exposed. The insulating layer 113 is a layer containing an organic material and is another organic layer different from the organic layer 118. The coated section 52 is formed of the insulating layer 113 and the organic layer 118, which are organic layers that cover part of a side surface 51a of the recess 51, and the organic layer 118 that covers a bottom surface 51b, which is continuous with part of the side surface 51a.

The recess 51 may have a rectangular shape, a circular shape, a polygonal shape, or an oval shape when viewed from the light exiting direction Z. In the present embodiment, the recess 51 has a rectangular shape when viewed from the light exiting direction Z and has four side surfaces 51a, as shown in FIG. 7.

The conductor exposed section 53 is provided along one or more to three or less of the four side surfaces 51a. The coated section 52 is provided on at least one of the side surfaces 51a excluding the region that forms the conductor exposed section 53. In FIG. 6, the conductor exposed section 53 is provided along one of two side surfaces 51a of the recess 51, and the coated section 52 is provided on the side facing the other side surface 51a different from the one side surface 51a described above and on the bottom surface 51b.

The cathode electrode layer 119 is provided on the insulating layer (organic layer) 113, which forms the coated section 52, and the organic layer 118. One end 119a of the cathode electrode layer 119 is connected to the conductor exposed section 53. The cathode electrode layer 119 only needs to be in contact with at least part of the conductor exposed section 53.

The recess 51 is formed, for example, by depositing the conductor layer 50 on the gate insulating layer 103 and the protective layer 106 having been etched in advance. The conductor layer 50 is made of a metal material, and the one side surface 51a and the other side surface 51a of the recess 51 after the etching are parallel to the light exiting direction Z. The coated section 52 is formed, for example, by using photolithography. Specifically, the coated section 52 is formed by exposing light to the insulating layer 113 temporarily formed on the recess 51 via a mask having a predetermined shape and then etching the insulating layer 113 with part thereof left unetched. The manufacturing method described above allows formation of a sloping insulating layer 113 on the other side surface 51a of the recess 51. The organic layer 118 described above is then formed on the sloping insulating layer 113 provided in the recess 51 and on the bottom surface 51b.

In a cross-sectional view of the recess 51 taken along a plane parallel to the light exiting direction Z, a surface 118a of the organic layer 118 in the coated section 52 is less steep than the side surfaces 51a of the recess 51 in the conductor exposed section 53 (surface 50a of conductor layer 50), as shown in FIG. 6. For example, the inclination angle of the side surfaces 51a described above is 90°, whereas the inclination angle of the surface 118a of the organic layer is greater than or equal to 75° but smaller than or equal to 85°.

The cathode electrode layer 119 is formed on the sloping organic layer 118. Since the organic layer 118 has a sloping shape, the cathode electrode layer 119 formed in sputtering or vacuum deposition is so continuously formed as not to be discontinuous on the organic layer 118.

As described above, in the display panel 10, the cathode electrode layer 119 is provided on the sloping organic layer 118, and one end 119a of the cathode electrode layer 119 is connected to the conductor exposed section 53. The connection of the cathode electrode layer 119 to the conductor layer 50, which has low resistance, via the conductor exposed section 53 allows a decrease in resistance of the cathode electrode layer 119. Poor image quality resulting from variation in potential at the cathode section CA of each of the organic EL elements 90 in the display panel 10 can thus be suppressed.

The depth dimension of the recess 51 is greater than the total thickness dimension of the organic layer 118 and the cathode electrode layer 119. For example, the recess 51 has a depth of 500 nm, whereas the organic layer 118 has a thickness of 100 nm and the cathode electrode layer 119 has a thickness of 100 nm. The dimensional relationship allows a structure in which one end 119a of the cathode electrode layer 119 is reliably connected to the conductor exposed section 53.

The conductor layer 50 is formed of a conductor layer main body 55 and a conductor layer surface section 56, which covers the surface of the conductor layer main body 55, as shown in FIGS. 6 and 7. The conductor layer surface section 56 is a coating film and formed along the surface of the conductor layer main body 55 having the recess 51. For example, the conductor layer main body 55 is made of aluminum, and the conductor layer surface section 56 is made of titanium. That is, the conductor layer surface section 56 is made of a material that is more unlikely to be oxidized than the conductor layer main body 55. One end 119a of the cathode electrode layer 119 is electrically continuous with the conductor layer main body 55 via the conductor layer surface section 56. In the present embodiment, since the cathode electrode layer 119 is connected to the conductor layer surface section 56, which is unlikely to be oxidized, an increase in contact resistance can be suppressed, as compared with a case where the cathode electrode layer 119 is directly connected to the conductor layer main body 55, which is likely to be oxidized.

[1-4. Effects and Others]

Figure 8:
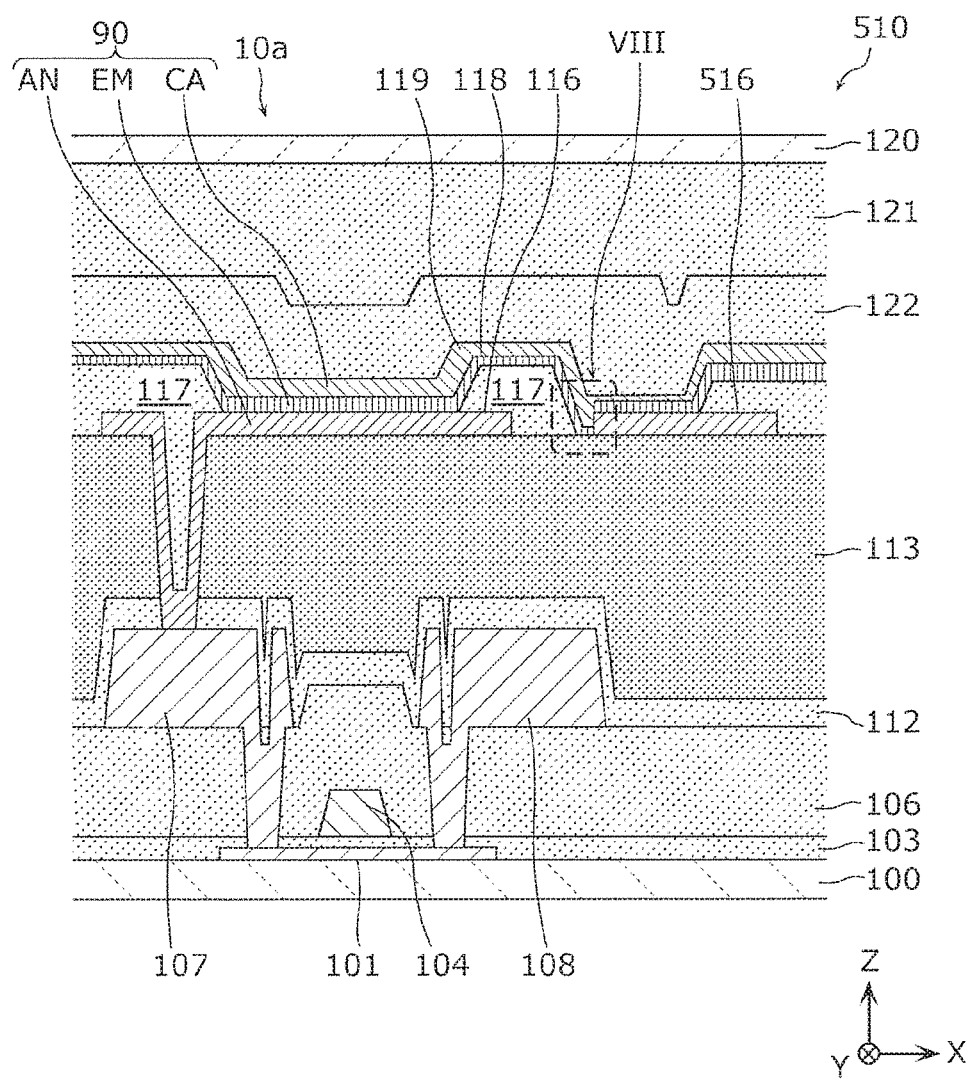
FIG. 8 is a cross-sectional view of an organic EL display panel according to Comparative Example.

To show effects provided by the display panel 10 having the configuration described above, the configuration of an organic EL display panel 510 according to Comparative Example will be described. FIG. 8 is a cross-sectional view of the display panel 510 according to Comparative Example.

The display panel 510 according to Comparative Example is provided with an auxiliary electrode 516, which lowers the resistance of the cathode electrode layer 119, in the layer where the anode electrode layer 116 is present. In the display panel 510, to connect the cathode electrode layer 119 to the auxiliary electrode 516, the organic layer 118 is so structured as to be divided into two portions that are discontinuous with each other (see portion VIII in FIG. 8). The cathode electrode layer 119 is therefore in contact only with part of the side surface of the auxiliary electrode 516, resulting in insufficient connection between the cathode electrode layer 119 and the auxiliary electrode 516.

On the other hand, the organic EL display panel 10 according to Embodiment 1 includes a plurality of pixels 10a. The plurality of pixels 10a each include an anode electrode layer 116, an organic layer 118, and a cathode electrode layer 119, the organic layer 118 having an area greater than an area of the anode electrode layer 116, at least part of the organic layer 118 covering the anode electrode layer 116, at least part of the cathode electrode layer 119 covering the organic layer 118. Each of the organic layer 118 and the cathode electrode layer 119 is continuously shared by the plurality of pixels 10a. The plurality of pixels 10a each include at least one organic EL element 90. The at least one organic EL element 90 includes an anode section AN that is part of the anode electrode layer 116, a cathode section CA that is part of the cathode electrode layer 119, and a light emitting section EM that is part of the organic layer 118 and located between the anode section AN and the cathode section CA. The organic EL display panel 10 further includes a conductor layer 50 having a recess 51, the conductor layer 50 being located in a region outside a region of the at least one organic EL element 90 in a view from a light exiting direction Z in which the at least one organic EL element 90 emits light. The recess 51 in the conductor layer 50 includes a coated section 52 and a conductor exposed section 53. The coated section 52 is covered with the organic layer 118, the conductor exposed section 53 is not covered with the organic layer 118, and the conductor exposed section 53 exposes the conductor layer 50. The cathode electrode layer 119 is connected to at least part of the conductor exposed section 53.

As described above, the connection of the cathode electrode layer 119 to the conductor exposed section 53 of the recess 51 allows reliable connection of the cathode electrode layer 119 to the conductor layer 50. The resistance of the cathode electrode layer 119 can thus be lowered, whereby poor image quality resulting from variation in potential at the cathode section CA of each of the organic EL elements 90 in the display panel 10 can be suppressed.

It is possible that the coated section 52 includes part of the organic layer 118, the part of the organic layer 118 covering (i) part of a side surface 51a of the recess 51 and (ii) a bottom surface of the recess 51 that is continuous with the part of the side surface 51a, and that the cathode electrode layer 119 is disposed on the part of the organic layer 118 serving as the coated section 52, the cathode electrode layer 119 being connected to the conductor exposed section 53.

Providing the cathode electrode layer 119 on the organic layer 118 in the recess 51 as described above allows reliable connection of the cathode electrode layer 119 to the conductor exposed section 53 in the conductor layer 50. The resistance of the cathode electrode layer 119 can thus be lowered, whereby poor image quality resulting from variation in potential at the cathode section CA of each of the organic EL elements 90 in the display panel 10 can be suppressed.

It is also possible that the recess 51 has a rectangular shape in a view from the light exiting direction Z and includes four side surfaces 51a, that the conductor exposed section 53 is located on one or more to three or less of the four side surfaces 51a, and that the coated section 52 is located on at least one of the four side surfaces 51a excluding a region serving as the conductor exposed section 53.

The cathode electrode layer 119 can thus be reliably connected to the conductor exposed section 53 along some of the side surfaces 51a of the recess 51. The resistance of the cathode electrode layer 119 can thus be lowered, whereby poor image quality resulting from variation in potential at the cathode section CA of each of the organic EL elements 90 in the display panel 10 can be suppressed.

It is further possible that in a cross-sectional view of the recess 51 taken along a plane parallel to the light exiting direction Z, a surface 118a of the organic layer 118 in the coated section 52 is less steep than the one or more to three or less of the four side surfaces 51a where the coated section 52 is located.

The cathode electrode layer 119 provided on the organic layer 118 can thus be formed in a continuous shape, whereby the cathode electrode layer 119 can be reliably connected to the conductor layer 50. The resistance of the cathode electrode layer 119 can thus be lowered, whereby poor image quality resulting from variation in potential at the cathode section CA of each of the organic EL elements 90 in the display panel 10 can be suppressed.

It is further possible that the organic EL display panel 10 further includes: a thin film transistor (TFT) layer t1 disposed above a TFT substrate 100; an EL layer e1 including the anode electrode layer 116, the organic layer 118, and the cathode electrode layer 119; and an interlayer insulating layer i1 located between the TFT layer t1 and the EL layer e1, that the conductor layer 50 is a metal layer comprising a same metal as a metal of a power source line Va in the TFT layer t1k, and that the coated section 52 includes part of the interlayer insulating layer it and part of the organic layer 118.

The above configuration in which the conductor layer 50 is a metal layer including the same metal as a metal of the power source lines Va allows a decrease in the resistance of the conductor layer 50. The resistance of the cathode electrode layer 119 can thus be further lowered, whereby poor image quality resulting from variation in potential at the cathode section CA of each of the organic EL elements 90 in the display panel 10 can be suppressed.

It is further possible that the organic EL display panel 10 further includes one of a semiconductor material layer 102 and a different conductor layer between the conductor layer 50 and the TFT substrate 100, the different conductor layer being different from the conductor layer 50.

Therefore, when the recesses 51 are formed in the step before the conductor layer 50 is formed, a situation in which the TFT substrate 100 is etched, for example, in an etching process can be avoided.

It is further possible that the organic EL display panel 10 further includes a different conductor layer between the conductor layer 50 and the TFT substrate 100, the different conductor layer being different from the conductor layer 50, and that the conductor layer 50 is connected to the different conductor layer.

The resistance of the conductor layer 50 can thus is lowered. The resistance of the cathode electrode layer 119 can thus be further lowered, whereby poor image quality resulting from variation in potential at the cathode section CA of each of the organic EL elements 90 in the display panel 10 can be suppressed.

Embodiment 2

An organic EL display panel 10A according to Embodiment 2 will next be described with reference to FIGS. 9 and 10. The organic EL display panel 10A (hereinafter referred to as display panel 10A) according to Embodiment 2 differs from the display panel 10 according to Embodiment 1 in that the conductor layer 50 is formed of a layer containing the same material as that of the anode electrode layer 116.

Figure 9:
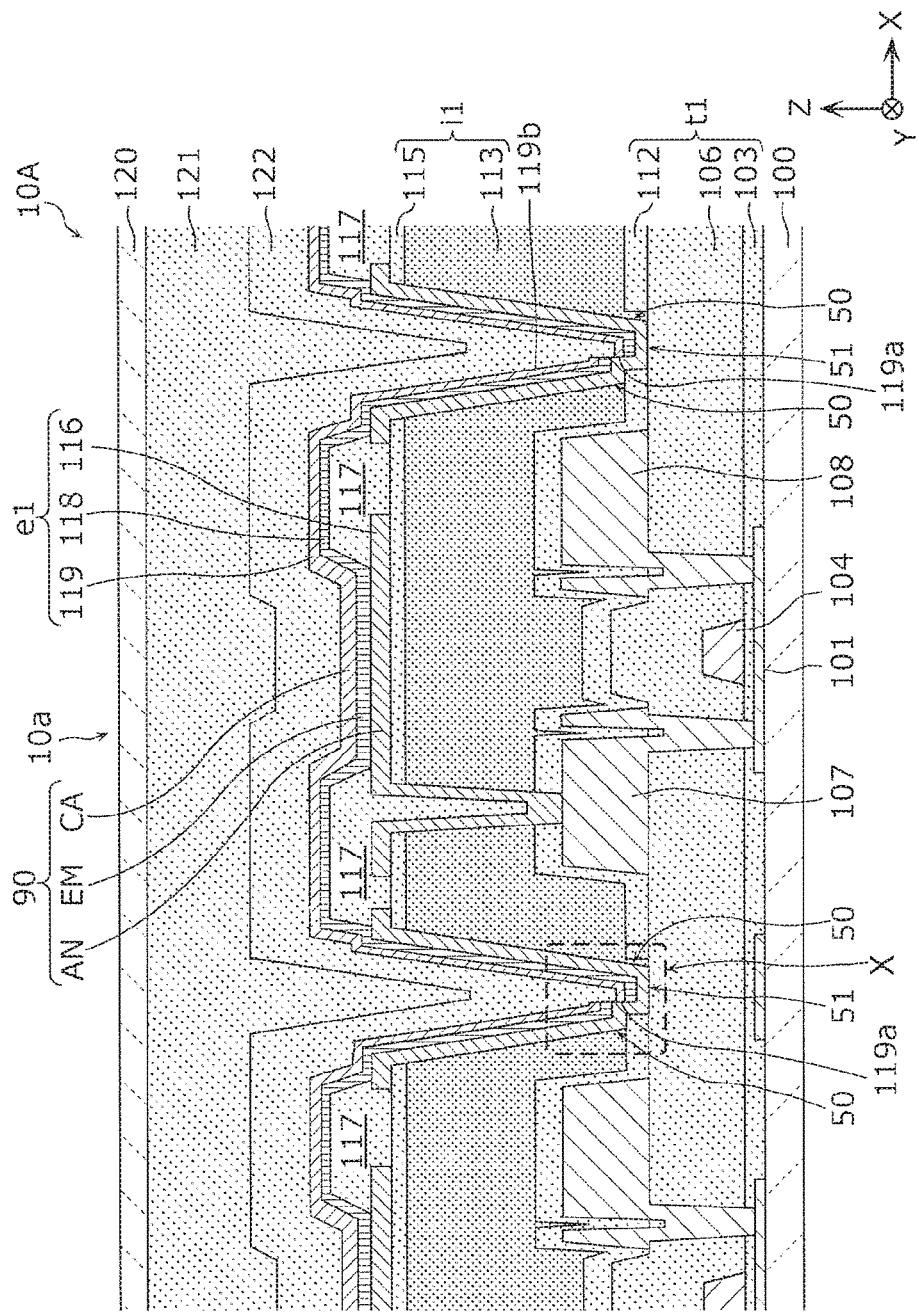
FIG. 9 is a cross-sectional view of an organic EL display panel according to Embodiment 2.

FIG. 9 is a cross-sectional view of the display panel 10A.

The conductor layer 50 in Embodiment 2 is formed simultaneously with the formation of the anode electrode layer 116. The conductor layer 50 is an auxiliary electrode for lowering the resistance of the cathode electrode layer 119 and is not electrically connected to the anode electrode layer 116. The conductor layer 50 is so formed as to pass through the insulating layers 115 and 113. The conductor layer 50 contains a low-resistance material and is a laminate made of tungsten and aluminum or an aluminum alloy. The conductor layer 50 is connected to the layer where the power source lines Va, which are not shown, are present.

The conductor layer 50 is so formed as to have recesses 51 each having a V-letter-shaped or U-letter-shaped cross section. The organic layer 118, the cathode electrode layer 119, and the protective film 122 are formed in the recesses 51. One end 119a of the cathode electrode layer 119 is connected to the conductor layer 50 in each of the recesses 51.

The structure of each of the recesses 51 in the conductor layer 50 will now be described. FIG. 10 is an enlarged view of each of the recesses 51 in the conductor layer 50 in the display panel 10A (portion X shown in FIG. 9).

Figure 10:
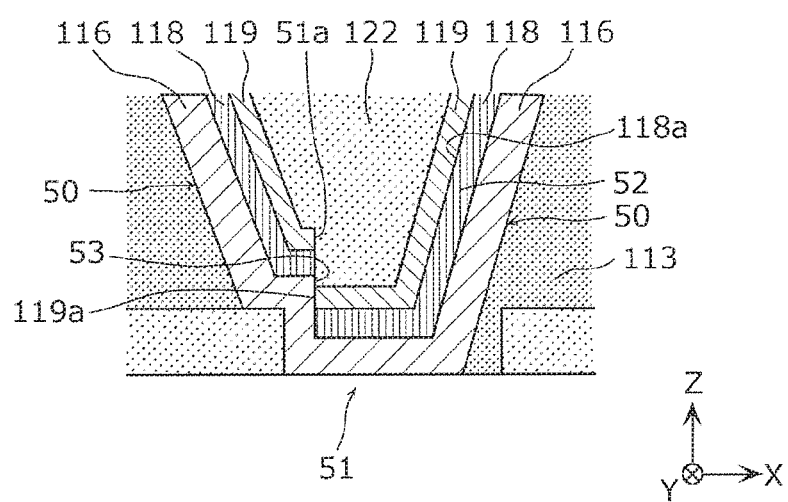
FIG. 10 is an enlarged view of a recess in a conductor layer of the organic EL display panel shown in FIG. 9.

The recess 51 in the conductor layer 50 includes a coated section 52 and a conductor exposed section 53, as shown in FIG. 10. The coated section 52 is a portion covered with the organic layer 118. The conductor exposed section 53 is a portion where it is not covered with the organic layer 118 but the conductor layer 50 is exposed. That is, the coated section 52 is formed of part of the side surfaces 51a of the recess 51 and the organic layer that covers the bottom surface 51b, which is continuous with part of the side surfaces 51a.

The recess 51 may have a rectangular shape, a circular shape, a polygonal shape, or an oval shape when viewed from the light exiting direction Z.

The cathode electrode layer 119 is provided on the insulating layer (organic layer) 113, which forms the coated section 52, and the organic layer 118. One end 119a of the cathode electrode layer 119 is connected to the conductor exposed section 53. The cathode electrode layer 119 only needs to be in contact with at least part of the conductor exposed section 53.

In a cross-sectional view of the recess 51 taken along a plane parallel to the light exiting direction Z, the surface 118a of the organic layer 118 in the coated section 52 is less steep than the side surfaces 51a of the recess 51 in the conductor exposed section 53, as shown in FIG. 10.

The cathode electrode layer 119 is formed on the sloping organic layer 118. Since the organic layer 118 has a sloping shape, the cathode electrode layer 119 formed in sputtering or vacuum deposition is so continuously formed as not to be discontinuous on the organic layer 118.

As described above, in the display panel 10A according to Embodiment 2, the cathode electrode layer 119 is provided on the sloping organic layer 118 and connected to the conductor exposed section 53. The connection of the cathode electrode layer 119 to the conductor layer 50, which has low resistance, via the conductor exposed section 53 allows a decrease in resistance of the cathode electrode layer 119. Poor image quality resulting from variation in potential at the cathode section CA of each of the organic EL elements 90 in the display panel 10A can thus be suppressed.

Further, the conductor layer 50 in Embodiment 2 is a layer containing the same material as that of the anode electrode layer 116 and is not connected to the anode electrode layer 116.

As described above, using the conductor layer 50, which is not connected to the anode electrode layer 116, as the auxiliary electrode allows a decrease in the resistance of the cathode electrode layer 119 connected to the conductor layer 50. Poor image quality resulting from variation in potential at the cathode section CA of each of the organic EL elements 90 in the display panel 10A can thus be suppressed.

Embodiment 3

An organic EL display panel 10B according to Embodiment 3 will next be described with reference to FIGS. 11 and 12. In the organic EL display panel 10B (hereinafter referred to as display panel 10B) according to Embodiment 3, the pixels 10a are each formed of a plurality of sub-pixels.

Figure 11:
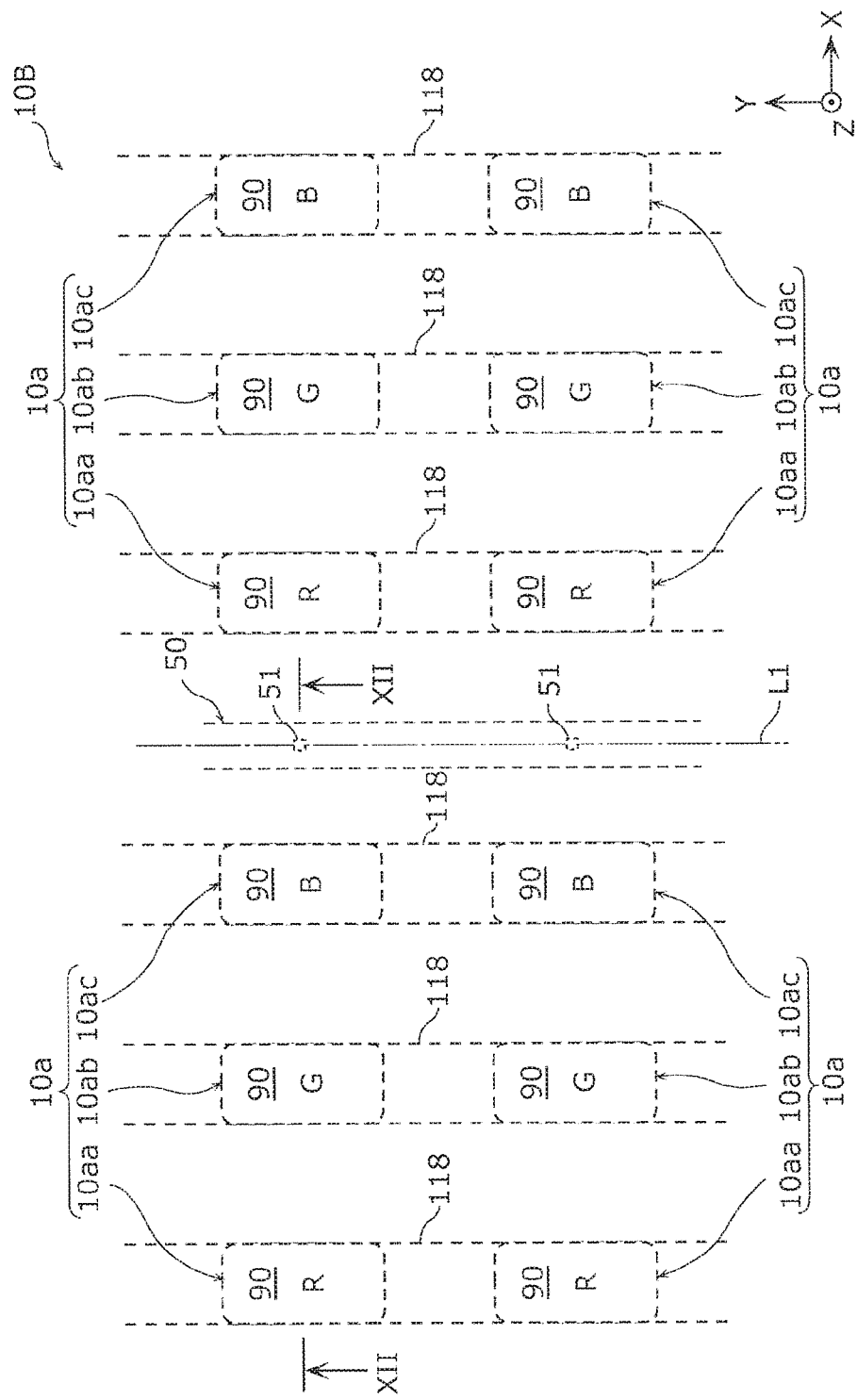
FIG. 11 is a diagrammatic view of an organic EL display panel according to Embodiment 3 viewed from the light exiting direction.
Figure 12:
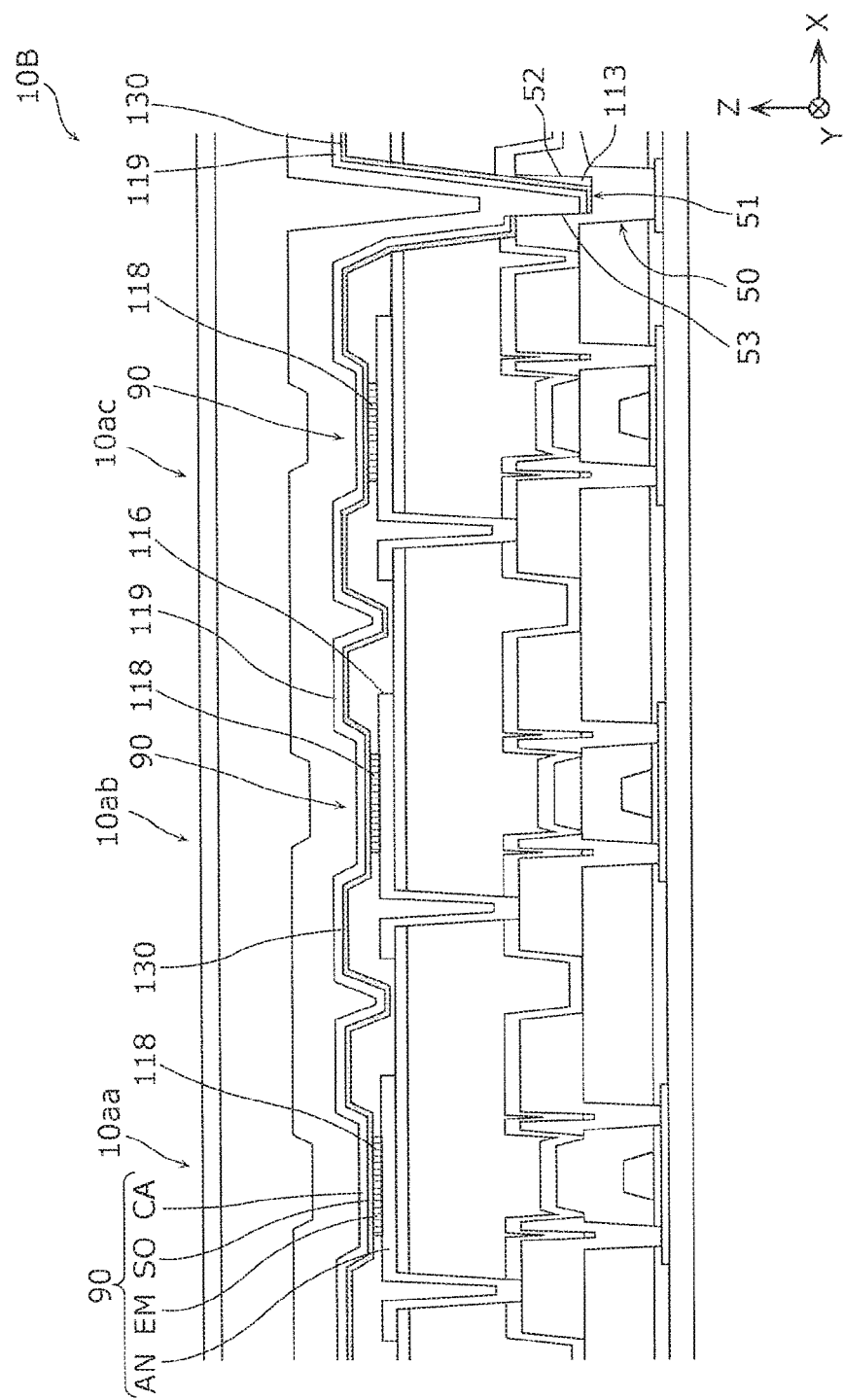
FIG. 12 is a cross-sectional view of the organic EL display panel according to Embodiment 3 taken along the line XII-XII shown in FIG. 11.

FIG. 11 is a diagrammatic view of the display panel 10B viewed from the light exiting direction. FIG. 12 is a cross-sectional view of the display panel 10B taken along the line XII-XII shown in FIG. 11. In FIG. 12, only the organic layer 118 and an organic common layer 130 are hatched.

The plurality of pixels 10a are arranged in a matrix along the first direction X and the second direction Y. The pixels 10a include a plurality of sub-pixels 10aa, 10ab, and 10ac, which are arranged along the first direction X and output light having difference colors. For example, the sub-pixel 10aa outputs red (R) light, the sub-pixel 10ab outputs green (G) light, and the sub-pixel 10ac outputs blue (B) light. Further, the plurality of pixels 10a are so arranged that the plurality of same-color sub-pixels 10aa to 10ac that output light having the same color are arranged in the second direction Y.

The plurality of sub-pixels 10aa to 10ac each include the anode electrode layer 116, the organic layer 118, at least part of which is so disposed as to cover the anode electrode layer 116, the organic common layer 130, the area of which is greater than those of the anode electrode layer 116 and the organic layer 118 and at least part of which is so disposed as to cover the organic layer 118, and the cathode electrode layer 119, the area of which is greater than those of the anode electrode layer 116 and the organic layer 118 and which is so disposed as to cover the organic common layer 130.

The organic common layer 130 is a layer containing an organic material and is formed, for example, of an electron transportation layer and an electrode injection layer. A hole injection layer and a hole transportation layer (not shown) are provided between the anode electrode layer 116 and the organic layer 118.

Each of the organic common layer 130 and the cathode electrode layer 119 is continuously shared in the regions between the plurality of sub-pixels 10aa to 10ac adjacent to each other in the first direction X. The organic layer 118 is continuous in the regions between the same-color sub-pixels 10aa to 10ac arranged in the second direction Y.

The plurality of sub-pixels 10aa to 10ac each includes the organic EL element 90. The organic EL elements 90 each include the anode section AN, which is part of the anode electrode layer 116, the cathode section CA, which is part of the cathode electrode layer 119, the light emitting section EM, which is part of the organic layer 118 and provided between the anode section AN and the cathode section CA, and an interlayer organic section SO, which is part of the organic common layer 130 (part of electron transportation layer and part of electron injection layer) and provided between the light emitting section EM and the cathode section CA. A hole injection section (not shown) that is part of the hole injection layer, and a hole transportation section (not shown) that is part of the hole transportation layer, are provided between the anode section AN and the light emitting section EM.

The conductor layer 50 having the recesses 51 is provided in the regions of predetermined pixels 10a out of the plurality of the pixels 10a arranged in the first direction X. The recesses 51 in the conductor layer 50 each include the coated section 52, which is covered with the organic common layer 130, and the conductor exposed section 53, which is not covered with the organic common layer 130 and where the conductor layer 50 is exposed. The cathode electrode layer 119 is connected to at least part of the conductor exposed section 53. The coated section 52 is formed of part of the side surfaces of the recess 51 and the organic common layer 130, which covers the bottom surface continuous with part of the side surfaces, and the cathode electrode layer 119 is provided on the organic common layer 130, which forms the coated section 52, and connected to the conductor exposed section 53.

The organic EL display panel 10B according to Embodiment 3 includes a plurality of pixels 10a arranged in a matrix along a first direction X and a second direction Y that intersects the first direction X. The plurality of pixels 10a each include a plurality of sub-pixels 10aa to 10ac having different colors, the plurality of sub-pixels 10aa to 10ac of the plurality of pixels 10a being arranged along the first direction X. The plurality of sub-pixels 10aa to 10ac each include an anode electrode layer 116, an organic layer 118, an organic common layer 130, and a cathode electrode layer 119, at least part of the organic layer 118 covering the anode electrode layer 116, the organic common layer 130 having an area greater than an area of each of the anode electrode layer 116 and the organic layer 118, at least part of the organic common layer 130 covering the organic layer 118, the cathode electrode layer 119 having an area greater than the area of each of the anode electrode layer 116 and the organic layer 118, and at least part of the cathode electrode layer 119 covering the organic common layer 130. Each of the organic common layer 130 and the cathode electrode layer 119 is continuously shared by at least adjacent sub-pixels 10aa to 10ac adjacent to each other in the first direction X among the plurality of sub-pixels 10aa to 10ac. The plurality of sub-pixels 10aa to 10ac each include an organic EL element 90. The organic EL element 90 includes an anode section AN that is part of the anode electrode layer 116, a cathode section CA that is part of the cathode electrode layer 119, a light emitting section EM that is part of the organic layer 118 and located between the anode section AN and the cathode section CA, and an interlayer organic section that is part of the organic common layer 130 and located between the light emitting section EM and the cathode section CA. The organic EL display panel 10B further includes a conductor layer 50 having a recess 51, the conductor layer 50 being located between at least two of the plurality of pixels 10a arranged in the first direction X. The recess 51 in the conductor layer 50 includes a coated section 52 and a conductor exposed section 53. The coated section 52 is covered with the organic common layer 130, the conductor exposed section 53 is not covered with the organic common layer 130, and the conductor exposed section 53 exposes the conductor layer 50. The cathode electrode layer 119 is connected to at least part of the conductor exposed section 53.

Also in the thus configured display panel 10B, the connection of the cathode electrode layer 119 to the conductor exposed section 53 of each of the recesses 51 allows reliable connection of the cathode electrode layer 119 to the conductor layer 50. The resistance of the cathode electrode layer 119 can thus be lowered, whereby poor image quality resulting from variation in potential at the cathode section CA of each of the organic EL elements 90 in the display panel 10B can be suppressed.

Furthermore, the organic EL element 90 is not present on an axial line L1 parallel to the second direction Y and passing through the recess 51 when viewed in a direction perpendicular to both the first direction X and the second direction Y.

For example, in Comparative Example shown in FIG. 8, the organic layer 118 needs to be so formed as to be divided into two portions in order to connect the cathode electrode layer 119 to the auxiliary electrode 516. In contrast, providing the recesses 51 in regions where no organic EL element 90 is preset readily allows the connection between the conductor layer 50 and the cathode electrode layer 119, as in the display panel 10B according to the present embodiment. The organic common layer 130 may be so configured that part thereof is provided along an axial line L1.

It is possible that the plurality of sub-pixels 10aa to 10ac include a plurality of same-color sub-pixels that output light having a same color, that the plurality of same-color sub-pixels are arranged along the second direction Y, and that the organic common layer 130 is continuously shared by at least two of the same-color sub-pixels (10aa, 10aa, for example) arranged in the second direction Y.

As described above, even in the case where the same-color sub-pixels 10aa to 10ac arranged in the second direction Y are shared, the connection of the cathode electrode layer 119 to the conductor exposed section 53 of each of the recesses 51 allows reliable connection of the cathode electrode layer 119 to the conductor layer 50. The resistance of the cathode electrode layer 119 can thus be lowered, whereby poor image quality resulting from variation in potential at the cathode section CA of each of the organic EL elements 90 in the display panel 10B can be suppressed.

Other Embodiments

The display panels 10, 10A, and 10B according to the present disclosure have been described based on the embodiments, but the present disclosure is not limited to the embodiments described above. The present disclosure also encompasses a variation obtained by changing any of the embodiments described above in a variety of manners that a person skilled in the art conceive of to the extent that the change does not depart from the substance of the present disclosure and a variety of instruments that incorporate any of the display panels 10 to 10B according to the present disclosure.

For example, the organic EL elements 90 may each be formed by sequentially layering an anode electrode layer, a hole injection layer, an organic layer, an electron injection layer, and a cathode electrode layer. Further, a hole transportation layer may be formed between the hole injection layer and the organic layer. An electron transportation layer may be formed between the organic layer and the electron injection layer. To prevent electrons from reaching the hole transportation layer, an electron blocking layer may be formed between the hole transportation layer and the organic layer.

For example, the above embodiments have been described with reference to the configuration in which the pixels 10a each include the two transistors Tr1 and Tr2 and one capacitor C, but not necessarily. For example, the pixels 10a may be configured to each include three transistors and one capacitor. The transistors Tr1 and Tr2 may each be an n-channel field effect transistor or a p-channel field effect transistor.

For example, the case where the pixels 10a are each formed of the plurality of sub-pixels 10aa to 10ac has been presented in Embodiment 3. Also in Embodiment 1, the pixels 10a may each be formed of a plurality of sub-pixels (sub-pixels 10aa to 10ac, for example).

INDUSTRIAL APPLICABILITY

The organic EL display panels according to the present disclosure are useful, for example, in a display apparatus that requires high display quality.

The invention claimed is:

1. An organic electro luminescence (EL) display panel comprising:
    a plurality of pixels,
    wherein the plurality of pixels each include an anode electrode layer, an organic layer, and a cathode electrode layer, the organic layer having an area greater than an area of the anode electrode layer, at least part of the organic layer covering the anode electrode layer, at least part of the cathode electrode layer covering the organic layer,
    each of the organic layer and the cathode electrode layer is continuously shared by the plurality of pixels,
    the plurality of pixels each include at least one organic EL element,
    the at least one organic EL element includes an anode section that is part of the anode electrode layer, a cathode section that is part of the cathode electrode layer, and a light emitting section that is part of the organic layer and located between the anode section and the cathode section,
    the organic EL display panel further includes a conductor layer having a recess, the conductor layer being located in a region outside a region of the at least one organic EL element in a view from a light exiting direction in which the at least one organic EL element emits light,
    the recess in the conductor layer includes a coated section and a conductor exposed section, the coated section being covered with the organic layer, the conductor exposed section not being covered with the organic layer, the conductor exposed section exposing the conductor layer, and
    the cathode electrode layer is connected to at least part of the conductor exposed section.

2. The organic EL display panel according to claim 1,
    wherein the coated section includes part of the organic layer, the part of the organic layer covering (i) part of a side surface of the recess and (ii) a bottom surface of the recess that is continuous with the part of the side surface, and
    the cathode electrode layer is disposed on the part of the organic layer serving as the coated section, the cathode electrode layer being connected to the conductor exposed section.

3. The organic EL display panel according to claim 1,
    wherein the recess has a rectangular shape in a view from the light exiting direction and includes four side surfaces, the conductor exposed section is located on one or more to three or less of the four side surfaces, and the coated section is located on at least one of the four side surfaces excluding a region serving as the conductor exposed section.

4. The organic EL display panel according to claim 3, wherein in a cross-sectional view of the recess taken along a plane parallel to the light exiting direction, a surface of the organic layer in the coated section is less steep than the one or more to three or less of the four side surfaces where the coated section is located.

5. The organic EL display panel according to claim 1, further comprising:

a thin film transistor (TFT) layer disposed above a TFT substrate;

an EL layer including the anode electrode layer, the organic layer, and the cathode electrode layer; and an interlayer insulating layer located between the TFT layer and the EL layer, wherein the conductor layer is a metal layer comprising a same metal as a metal of a power source line in the TFT layer, and the coated section includes part of the interlayer insulating layer and part of the organic layer.

6. The organic EL display panel according to claim 5, further comprising:

one of a semiconductor material layer and a different conductor layer between the conductor layer and the TFT substrate, the different conductor layer being different from the conductor layer.

7. The organic EL display panel according to claim 5, further comprising:

a different conductor layer between the conductor layer and the TFT substrate, the different conductor layer being different from the conductor layer, wherein the conductor layer is connected to the different conductor layer.

8. The organic EL display panel according to claim 1, wherein the conductor layer is a layer containing a material of the anode electrode layer, and the conductor layer is not connected to the anode electrode layer.

9. An organic electro luminescence (EL) display panel comprising:

a plurality of pixels arranged in a matrix along a first direction and a second direction that intersects the first direction, wherein the plurality of pixels each include a plurality of sub-pixels having different colors, the plurality of sub-pixels of the plurality of pixels being arranged along the first direction, the plurality of sub-pixels each include an anode electrode layer, an organic layer, an organic common layer, and a cathode electrode layer, at least part of the organic layer covering the anode electrode layer, the organic common layer having an area greater than an area of each of the anode electrode layer and the organic layer, at least part of the organic common layer covering the organic layer, the cathode electrode layer having an area greater than the area of each of the anode electrode layer and the organic layer, and at least part of the cathode electrode layer covering the organic common layer, each of the organic common layer and the cathode electrode layer is continuously shared by at least adjacent sub-pixels adjacent to each other in the first direction among the plurality of sub-pixels, the plurality of sub-pixels each include an organic EL element, the organic EL element includes an anode section that is part of the anode electrode layer, a cathode section that is part of the cathode electrode layer, a light emitting section that is part of the organic layer and located between the anode section and the cathode section, and an interlayer organic section that is part of the organic common layer and located between the light emitting section and the cathode section, the organic EL display panel further includes a conductor layer having a recess, the conductor layer being located between at least two of the plurality of pixels arranged in the first direction, the recess in the conductor layer includes a coated section and a conductor exposed section, the coated section being covered with the organic common layer, the conductor exposed section not being covered with the organic common layer, the conductor exposed section exposing the conductor layer, and the cathode electrode layer is connected to at least part of the conductor exposed section.

10. The organic EL display panel according to claim 9, wherein the organic EL element is not present on an axial line parallel to the second direction and passing through the recess when viewed in a direction perpendicular to both the first direction and the second direction.

11. The organic EL display panel according to claim 9, wherein the plurality of sub-pixels include a plurality of same-color sub-pixels that output light having a same color, the plurality of same-color sub-pixels are arranged along the second direction, and the organic common layer is continuously shared by at least two of the same-color sub-pixels arranged in the second direction.

* * * * *